United States Patent
Han et al.

(10) Patent No.: US 10,304,546 B2
(45) Date of Patent: May 28, 2019

(54) EXTERNAL STORAGE DEVICE AND METHOD OF SETTING REFERENCE FREQUENCY FOR THE SAME

(71) Applicant: SAMSUNG ELECTRONICS CO., LTD., Suwon-si (KR)

(72) Inventors: Il Su Han, Hwaseong-si (KR); Jong Hwa Kim, Hwaseong-si (KR); Dong Gi Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/736,472

(22) Filed: Jun. 11, 2015

(65) Prior Publication Data
US 2016/0005488 A1    Jan. 7, 2016

(30) Foreign Application Priority Data

Jul. 1, 2014    (KR) .................... 10-2014-0082135

(51) Int. Cl.
| | | |
|---|---|---|
| *G11C 16/32* | (2006.01) | |
| *G11C 16/20* | (2006.01) | |
| *G11C 29/02* | (2006.01) | |

(52) U.S. Cl.
CPC ............. *G11C 16/32* (2013.01); *G11C 16/20* (2013.01); *G11C 29/023* (2013.01); *G11C 29/028* (2013.01)

(58) Field of Classification Search
CPC ....... G11C 16/32; G11C 16/20; G11C 29/023; G11C 29/028
USPC .................................................. 365/185.18
See application file for complete search history.

(56) References Cited

U.S. PATENT DOCUMENTS

| | | |
|---|---|---|
| 4,989,223 A | 1/1991 | Katayose et al. |
| 6,343,364 B1 | 1/2002 | Leydier et al. |
| 7,427,027 B2 | 9/2008 | Elhamias et al. |
| 7,793,031 B2 | 9/2010 | Sartori et al. |
| 7,844,763 B2 | 11/2010 | Yu et al. |
| 7,876,703 B2 * | 1/2011 | Vageline ............... G06F 3/0607 370/254 |
| 7,895,377 B2 | 2/2011 | Cedar et al. |

(Continued)

FOREIGN PATENT DOCUMENTS

WO    2013179077 A1    12/2013

OTHER PUBLICATIONS

JESD220A, JEDEC Standard Universal Flash Storage (UFS 1.1), JEDEC Solid State Technology Association, Jun. 2012.*

(Continued)

*Primary Examiner* — Mushfique Siddique
(74) *Attorney, Agent, or Firm* — Sughrue Mion, PLLC

(57) ABSTRACT

An external storage device and method of setting a reference frequency for the same are provided. The external storage device includes: a device manager configured to set a reference frequency using information about the reference frequency for a high-speed mode received in a low-speed mode after the external storage device starts initialization, and control the external storage device to operate at the reference frequency in the high-speed mode, wherein the external storage device is a removable device which is attachable to and detachable from a host and is configured to operate according to a reference clock signal with the reference frequency in the high-speed mode.

18 Claims, 8 Drawing Sheets

(56) References Cited

U.S. PATENT DOCUMENTS

| | | | |
|---|---|---|---|
| 8,321,697 B2* | 11/2012 | Fujimoto | G06F 1/266 |
| | | | 713/300 |
| 8,621,128 B2 | 12/2013 | Radulescu et al. | |
| 2005/0132116 A1 | 6/2005 | Gillet | |
| 2005/0223148 A1 | 10/2005 | Kim | |
| 2009/0125672 A1* | 5/2009 | Ito | G06F 13/4234 |
| | | | 711/103 |
| 2010/0095164 A1* | 4/2010 | Kamei | G06F 17/30221 |
| | | | 714/48 |
| 2011/0060867 A1* | 3/2011 | Jung | G06F 3/0605 |
| | | | 711/103 |
| 2011/0087913 A1* | 4/2011 | Robles | G06F 1/3215 |
| | | | 713/330 |
| 2012/0120989 A1 | 5/2012 | Toriyama et al. | |
| 2013/0073797 A1* | 3/2013 | Chowdhury | G11C 16/3418 |
| | | | 711/103 |
| 2013/0086352 A1* | 4/2013 | Annepu | G06F 3/0605 |
| | | | 711/170 |
| 2013/0235659 A1 | 9/2013 | Gillingham et al. | |
| 2014/0105321 A1* | 4/2014 | Lin | H04L 1/0002 |
| | | | 375/295 |
| 2015/0032915 A1* | 1/2015 | Hur | G06F 5/06 |
| | | | 710/29 |
| 2015/0049552 A1* | 2/2015 | Park | G11C 16/30 |
| | | | 365/185.18 |
| 2015/0160689 A1* | 6/2015 | Mylly | G06F 1/08 |
| | | | 713/500 |
| 2015/0160873 A1* | 6/2015 | Mylly | G06F 3/0607 |
| | | | 711/162 |
| 2015/0350206 A1* | 12/2015 | Shin | H04L 63/0876 |
| | | | 713/170 |

OTHER PUBLICATIONS

JEDEC Standard, Universal Flash Storage (UFS) Version 2.0, JESD220B, Sep. 2013, JEDEC Solid State Technology Association.*

"Universal Flash Storage (UFS) Version 2.0", JEDEC Standard No. 220B, Sep. 2013, 366 pages total, URL: http://www.jedec.org.

Yuping Chung, "Total IP Solution for Mobile Storage UFS & NAND Controllers", Arasan Chip System, Mobile Forum Taiwan & Korea 2012.

* cited by examiner

EXTERNAL STORAGE DEVICE AND METHOD OF SETTING REFERENCE FREQUENCY FOR THE SAME

CROSS-REFERENCE TO RELATED APPLICATIONS

This application claims priority from Korean Patent Application No. 10-2014-0082135 filed on Jul. 1, 2014, the disclosure of which is incorporated herein in its entirety by reference.

BACKGROUND

Apparatuses and methods consistent with exemplary embodiments relate to an external storage device and a method of setting a reference frequency for the same, and more particularly, to an external storage device which can be used in various host environments and a method of setting a reference frequency for the same.

Portable electronic devices are getting more attention and the level of consumers' requirements becomes high. To meet the consumers' requirements, portable electronic devices have been developed to be lighter and to have higher performance. However, there is a limit to increasing performance in terms of price and technology.

A portable electronic device has a slot into which an external storage device can be inserted to extend a storage space. The external storage device communicates with a host at which the external storage device is installed and performs data processing in response to a command of the host. These operations may be performed using signals with very high frequency.

As the operations of the external storage device and the host are performed at a high speed, synchronization between the external storage device and the host has been increasingly important.

SUMMARY

According to an aspect of an exemplary embodiment, there is provided an external storage device including: a device manager configured to set a reference frequency using information about the reference frequency for a high-speed mode received in a low-speed mode after the external storage device starts initialization, and control the external storage device to operate at the reference frequency in the high-speed mode. The external storage device may be a removable device which is attachable to and detachable from a host and may operate according to a reference clock signal with the reference frequency in the high-speed mode.

The initialization may start at power-on of the host or in response to a reset signal transmitted from the host.

The external storage device may further include a device interface configured to communicate with the host in the low-speed mode and the high-speed mode, a data manager configured to interpret a type of data and control the data to be processed by the device manager, and a descriptor including a reference clock register configured to store a value corresponding to the information about the reference frequency.

The information about the reference frequency may be a command generated by the host.

The device manager may generate a register setting response in response to setting of the reference clock register being completed.

The external storage device may further include a signal detector configured to detect a voltage level of a signal received through a frequency setting pin connected to the host and to generate a frequency setting signal. At this time, the information about the reference frequency may be the frequency setting signal.

The external storage device may further include a signal detector configured to detect a frequency setting pin through which a signal is received among a plurality of frequency setting pins connected to the host and to generate a frequency setting signal. At this time, the information about the reference frequency may be the frequency setting signal.

The device manager may generate information about an optimum reference frequency for the high-speed mode and the reference frequency may be determined at the host based on the optimum reference frequency.

According to another aspect of an exemplary embodiment, there is provided a method of setting a reference frequency of an external storage device including: starting initialization of the external storage device which is removable from a host, recognizing the external storage device and linking up with the external storage device in a low-speed mode by the host, setting a reference frequency using information about the reference frequency for a high-speed mode received in the low-speed mode, and operating the external storage device at the reference frequency in the high-speed mode according to a reference clock signal with the reference frequency.

The initialization may start at power-on of the host or in response to a reset signal transmitted from the host.

The setting the reference frequency may include transmitting, by the host, a command to the external storage device in the low-speed mode and storing, by the external storage device, a value corresponding to the command in a reference clock register; and generating, by the external storage device, a register setting response and transmitting, by the external storage device, the register setting response to the host in response to setting of the reference clock register being completed.

The setting the reference frequency may include detecting a voltage level of a signal received through a frequency setting pin connected to the host and generating a frequency setting signal; and storing a value corresponding to the frequency setting signal in a reference clock register.

The setting the reference frequency may include detecting a frequency setting pin through which a signal is received among a plurality of frequency setting pins and generating a frequency setting signal; and storing a value corresponding to the frequency setting signal in a reference clock register.

The setting the reference frequency may include generating, by the external storage device, information about an optimum reference frequency for the high-speed mode and transmitting the information to the host.

According to another aspect of an exemplary embodiment, there is provided an external storage device including: a device manager configured to set a reference frequency using information about a first reference frequency for a first high-speed mode received in a first low-speed mode after the external storage device is connected to a first host and starts initialization and to set the reference frequency using information about a second reference frequency for a second high-speed mode received in a second low-speed mode after the external storage device is removed from the first host, is connected to a second host and starts initialization. The external storage device may be a removable device which is attachable to and detachable from the first and second hosts and may operate according to a reference clock signal with the reference frequency corresponding to the first reference frequency in the first high-speed mode and operate according to a reference clock signal with the reference frequency corresponding to the second reference frequency in the second high-speed mode.

The external storage device may be a universal flash storage (UFS).

The information about each of the first and second reference frequencies may be a command generated by the first and second hosts.

The external storage device may further include a signal detector configured to detect a voltage level of a signal received through a frequency setting pin and to generate a frequency setting signal. The information about each of the first and second reference frequencies may be the frequency setting signal.

The external storage device may further include a signal detector configured to detect a frequency setting pin through which a signal is received among a plurality of frequency setting pins and to generate a frequency setting signal. The information about each of the first and second reference frequencies may be the frequency setting signal.

The device manager may generate information about an optimum reference frequency for each of the first and second high-speed modes, and each of the first and second reference frequencies may be determined at the first and second hosts based on the optimum reference frequency.

BRIEF DESCRIPTION OF THE DRAWINGS

The above and other aspects will become more apparent from the following description of the exemplary embodiments with reference to the accompanying drawings, in which.

DETAILED DESCRIPTION OF THE EMBODIMENTS

Figure 1:
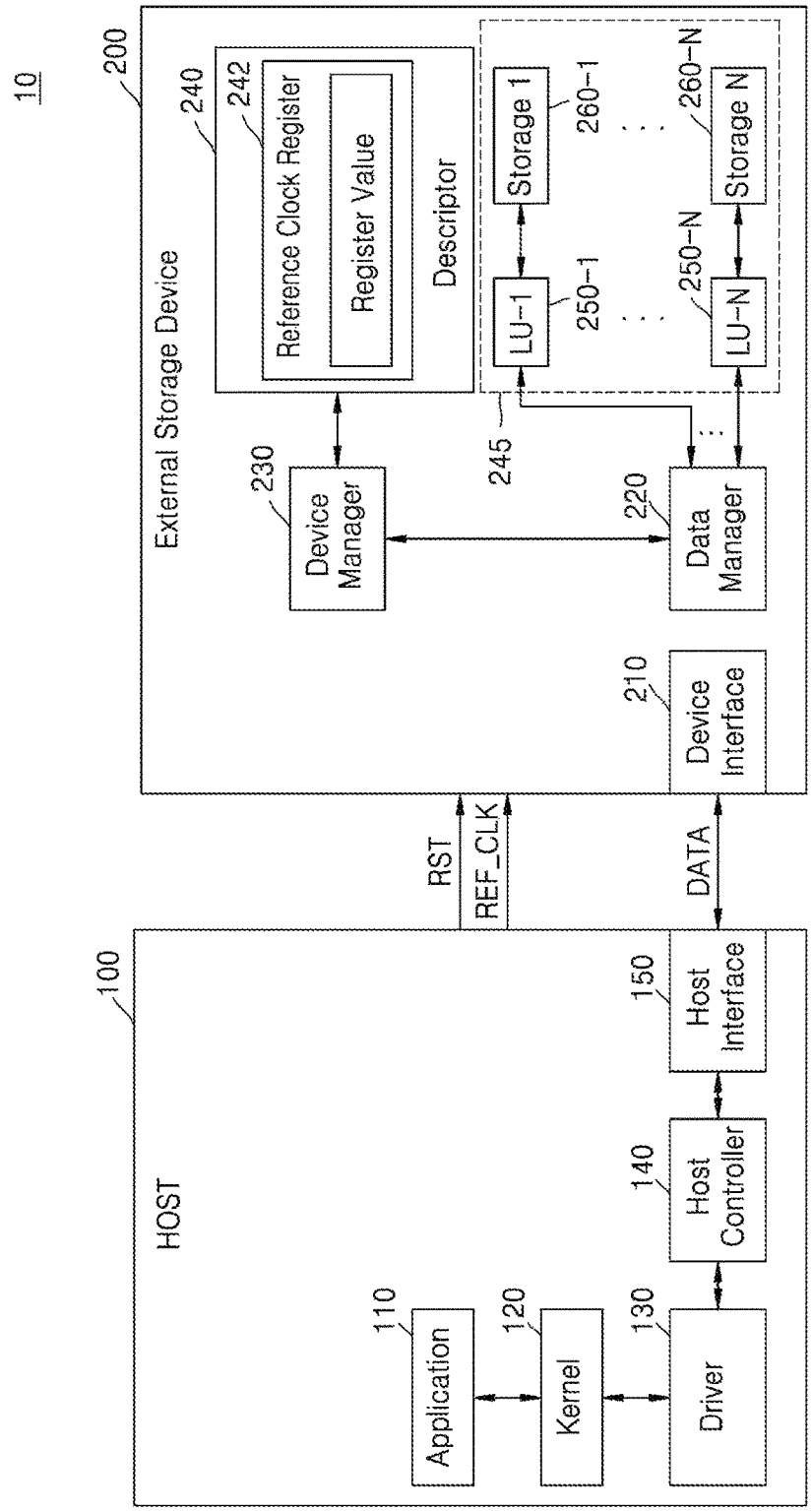
FIG. 1 is a block diagram of a data processing system according to an exemplary embodiment.

The inventive concept will be described hereinafter with reference to the accompanying drawings, in which exemplary embodiments thereof are shown. This inventive concept may, however, be embodied in many different forms and should not be construed as limited to the embodiments set forth herein. Rather, the exemplary embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular exemplary embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

The content disclosed in Joint Electron Devices Engineering Council (JEDEC) standard Universal Flash Storage (UFS) version 2.0, i.e., JESD220B published in September 2013 is hereby incorporated by reference. In addition, the standard specifications of Mobile Industry Processor Interface (MIPI) (i.e., M-PHY and UniPro specifications) are hereby incorporated by references. In detail, the MIPI alliance specification for M-PHYSM version 3.0 and the MIPI alliance specification for unified protocol (i.e., UniProSM) version 1.6 are hereby incorporated by references.

FIG. 1 is a block diagram of a data processing system 10 according to an exemplary embodiment. The data processing system 10 may be implemented as a smart phone, a tablet personal computer (PC), a camera, a personal digital assistant (PDA), a digital recorder, an MP3 player, an internet tablet, a mobile internet device (MID), a wearable computer, an electronic toy, etc.

The data processing system 10 may include a host 100 and an external storage device 200. Components 110 through 150 in the host 100 and components 210 through 245 in the external storage device 200 may be implemented in hardware, software, or combination thereof. A central processing unit (CPU) (not shown) in the host 100 or in the external storage device 200 may control operations of the components 110 through 150 or components 210 through 245 and may be implemented as a program or firmware stored in memory (not shown).

The host 100 may control the external storage device 200 and other devices included in the data processing system 10 and may be an application processor integrated circuit (IC). The host 100 may be implemented as a system on chip (SoC). The host 100 may include an application 110, a kernel 120, a driver 130, a host controller 140, and a host interface 150.

The application 110 may process a user command and transmit a request corresponding to the command to the kernel 120. The application 110 may be a group of a plurality of applications (e.g., a device unification management application, a device performance management application, a music player application, and a video player application, etc.).

When the external storage device 200 is installed at an external memory slot (not shown) compatible with the external storage device 200, the application 110 may recognize the external storage device 200 in a physical manner (e.g., of transforming a mechanical device connected to the host 100) or in an electrical manner (e.g., of connecting the external storage device 200 to an external pin connected to the host 100). When the power of the host 100 is turned off and then turned on in a state in which the external storage device 200 has been installed at the external memory slot, the application 110 may recognize the external storage device 200 in the physical or electrical manner.

In addition, when the host 100 transmits a reset signal RST to the external storage device 200 during the operation of the external storage device 200, the application 110 may recognize the external storage device 200 in the physical or electrical manner. The reset signal RST may be a signal for initializing system configuration of the external storage device 200 and may be generated by a reset signal generator (not shown) according to the control of the application 110.

Once the application 110 recognizes the external storage device 200, the application 110 may transmit a request corresponding to a command (e.g., a link-up command) for initializing the external storage device 200 to the kernel 120. When link-up between the host interface 150 and a device interface 210 is completed according to the link-up command, the application 110 may generate a register setting command and may transmit the register setting command to the external storage device 200.

In addition, when the external storage device 200 completes the setting of a reference clock register 242 of a descriptor 240 according to the register setting command, the external storage device 200 may transmit a register setting response to the host 100. After receiving the register setting response, the application 110 may generate a burst command, which will be described later.

The register setting command may include information about a reference frequency of a reference clock signal REF_CLK provided to the external storage device 200 in high-speed mode, which will be described later. The register setting command may be a query request and the register setting response may be a query response.

When the application 110 receives information about an optimum reference frequency for the high-speed mode from the external storage device 200, the application 110 may control a reference clock generator (not shown) to generate the reference clock signal REF_CLK with the reference frequency determined according to the optimum reference frequency and to provide the reference clock signal REF_CLK to the external storage device 200 in the high-speed mode.

The kernel 120 may convert a request from the application 110 into a function that can be recognized by the driver 130 and may transmit the function to the driver 130. The kernel 120 may be an operating system (OS).

The driver 130 may convert the function into data in a format that can be recognized by a device to which data corresponding to the user's request is transmitted, i.e., the external storage device 200. For instance, when the external storage device 200 is a universal flash storage (UFS) device, the driver 130 may convert the function into a UFS Protocol Information Unit (UPIU) format.

The host controller 140 may transmit data from the driver 130 to the host interface 150 or may interpret data received from the host interface 150 and then transmit the data to the driver 130. For instance, if the external storage device 200 is a UFS device, the host controller 140 may include a UFS host controller.

The host interface 150 may communicate data with the external storage device 200 in low-speed mode or in high-speed mode. The host interface 150 may include MIPI M-PHYSM.

The low-speed mode is a mode in which data is transferred between the host 100 and the external storage device 200 using a signal with a relatively low frequency. Since a signal with a relatively low frequency is used in the low-speed mode, data can be transferred without the reference clock signal REF_CLK. The low-speed mode may be a pulse width modulation (PWM) mode.

The reference clock signal REF_CLK may be used to catch a data value of a data signal DATA. The reference clock signal REF_CLK may also determine an internal operating speed of the external storage device 200 for the synchronization between the host 100 and the external storage device 200.

The high-speed mode is a mode in which data is transferred between the host 100 and the external storage device 200 using a signal with a relatively high frequency. Since a signal with a relatively high frequency is used in the high-speed mode, the reference clock signal REF_CLK is essentially necessary.

When the request corresponding to the link-up command is transmitted from the application 110 to the host interface 150, the host interface 150 may try to link up with the device interface 210. The link-up may be an operation of confirming the connection between the host interface 150 of the host 100 and the device interface 210 of the external storage device 200.

When the external storage device 200 is initialized, after the host interface 150 links up with the device interface 210, the host interface 150 and the device interface 210 may operate in the low-speed mode.

To increase an operating speed of the external storage device 200 and a transmission speed between the external storage device 200 and the host 100, the application 110 may transmit a request corresponding to the burst command to the host interface 150. When the host interface 150 receives the request corresponding to the burst command, the host interface 150 and the device interface 210 may start to operate in the high-speed mode instead of the low-speed mode. The application 110 may control the reference clock generator to provide the reference clock signal REF_CLK with a reference frequency (e.g., of 19.2, 26, 38.4 or 52 MHz) determined according to the register setting command to the external storage device 200 in the high-speed mode.

The host interface 150 may identify a device identification (ID) included in data received from an outside and may transmit the data to the host controller 140 or a device (e.g., an embedded memory) corresponding to the device ID according to a result of the identification. The host interface 150 may generate a device ID based on data received from the host controller 140 and may transmit the data to a device corresponding to the device ID. A different device ID may be allocated to each independent device. The host interface 150 may include a MIPI UniPro.

The external storage device 200 may be a removable device that can be attached to and detached from the host 100, and more particularly, the external memory slot compatible with the external storage device 200. The external storage device 200 may be a UFS device. The external storage device 200 may include the device interface 210, a data manager 220, a device manager 230, the descriptor 240, and a storing unit 245. The data manager 220 and the device manager 230 may be implemented in software.

The device interface 210 may be positioned between the host 100 and the data manager 220. The structure and operations of the device interface 210 may be the same as those of the host interface 150 positioned between the external storage device 200 and the host controller 140. In other words, after the initialization of the external storage device 200 starts, the device interface 210 may be linked up with the host interface 150 and may communicate data with the host interface 150 in the low-speed mode or high-speed mode, as described above.

The data manager 220 may interpret a protocol of data received from the device interface 210 and control the data to be transmitted to the device manager 230 or to the storing unit 245. The data manager 220 may also convert data received from the device manager 230 or the storing unit 245 into a protocol that can be recognized by a device which receives the data, i.e., the host 100 and may control the data to be transmitted to the device interface 210. The protocol that the data manager 220 can interpret or convert may be a standard or nonstandard protocol.

The data manager 220 may interpret a protocol of data received from the device interface 210 and may determine to which of the device manager 230 and the storing unit 245 the data will be transmitted according to a type of the data. If the data is a command (e.g., a register setting command) related with system configuration of the external storage device 200, the data manager 220 may control the data to be processed by the device manager 230.

If the data includes write data to be written to the storing unit 245 or read data to be read from the storing unit 245, a write command or a read command, and address information regarding the write or read data, the data manager 220 may control the data to be transmitted to the storing unit 245. The data manager 220 may also determine to which of a plurality of logical units 250-1 through 250-N included in the storing unit 245 the data will be transmitted based on the address information.

The device manager 230 may control the overall operation of the external storage device 200. For instance, the device manager 230 may perform controls related with system configuration, such as initialization of the external storage device 200, change of speed mode, and determination of an operating frequency.

The device manager 230 may set the reference clock register 242 in the descriptor 240 according to a register setting command transmitted from the host 100 in the low-speed mode. The device manager 230 may store a value (e.g., 0, 1, 2, or 3) corresponding to the register setting command in the reference clock register 242. Once the setting of the reference clock register 242 in the descriptor 240 is completed, the device manager 230 may generate a register setting response and transmit the register setting response to the host 100.

When changing speed mode from the low-speed mode to the high-speed mode in response to a burst command from the host 100, the device manager 230 may refer to the reference clock register 242 and may control the external storage device 200 to operate at an operating frequency (e.g., of 19.2, 26, 38.4 or 52 MHz) corresponding to the value (i.e., 0, 1, 2, or 3) stored in the reference clock register 242.

According to an exemplary embodiment, the device manager 230 may generate information about an optimum reference frequency for the high-speed mode with reference to the descriptor 240 and may transmit the information to the host 100. The optimum reference frequency may be a reference frequency optimized for the high-speed mode according to the specification of the external storage device 200. The information about the optimum reference frequency may be generated at the request of the host 100.

The descriptor 240 may include a plurality of registers that store information about system configuration of the external storage device 200. One of the plurality of registers may be the reference clock register 242.

The storing unit 245 may include a plurality of the logical units 250-1 through 250-N and storages 260-1 through 260-N respectively corresponding to the logical units 250-1 through 250-N. Each of the logical units 250-1 through 250-N may perform a read operation or a write operation on a corresponding one of the storages 260-1 through 260-N.

In the read operation, each of the logical units 250-1 through 250-N may receive a read command and address information from the data manager 220 and may read data from memory cells corresponding to the address information in a corresponding one of the storages 260-1 through 260-N. The read data may be transmitted to the data manager 220. In the write operation, each of the logical units 250-1 through 250-N may receive a write command, write data, and address information from the data manager 220 and may write the data to memory cells corresponding to the address information in a corresponding one of the storages 260-1 through 260-N.

The address information may be information of a logical address. Each of the logical units 250-1 through 250-N may perform translation between the address information and a physical address based on a mapping table (not shown) that maps the address information to the physical address of each of the storages 260-1 through 260-N.

Each of the logical units 250-1 through 250-N may perform operations for management of life and maintenance of a corresponding one of the storages 260-1 through 260-N. The logical units 250-1 through 250-N may be memory controllers.

The storages 260-1 through 260-N may store or output data according to the control of the logical units 250-1 through 250-N, respectively. The storages 260-1 through 260-N may include non-volatile memory, such as NAND flash memory, NOR flash memory, resistance random access memory (RRAM), and phase-change RAM (PRAM).

According to an exemplary embodiment, the host 100 informs the external storage device 200 of the frequency of a reference clock signal for high-speed mode using a command during initialization while the external storage device 200 is operating without the reference clock signal in low-speed mode, so that the external storage device 200 can operate in various host environments in which different reference clocks are provided to the external storage device 200. In addition, the external storage device 200 informs the host 100 of information about an optimum frequency of the reference clock signal for high-speed mode during initialization while the external storage device 200 is operating without the reference clock signal in low-speed mode, so that the host 100 provides the reference clock signal to the external storage device 200 to allow the external storage device 200 to operate at the optimum frequency for high-speed mode.

Figure 2:
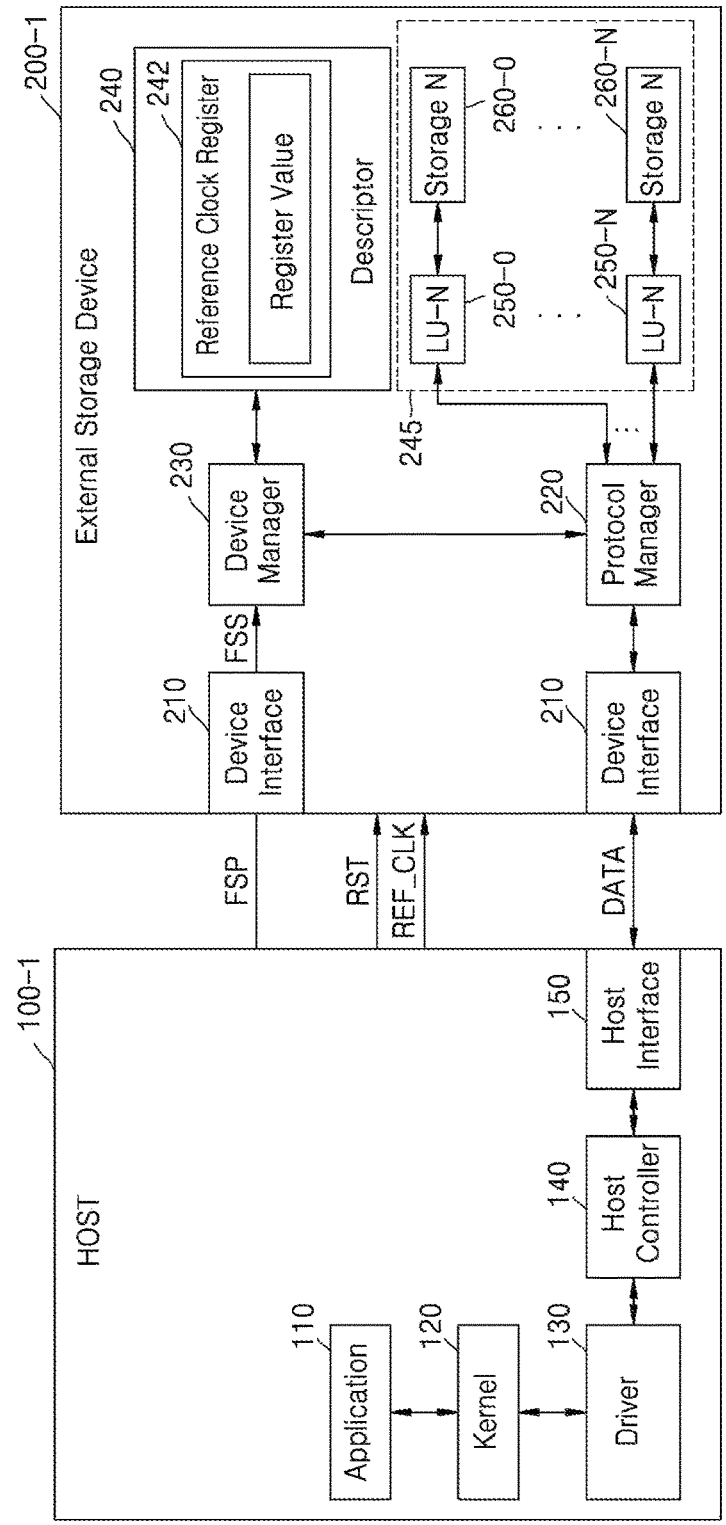
FIG. 2 is a block diagram of a data processing system according to another exemplary embodiment.

FIG. 2 is a block diagram of a data processing system 10-1 according to an exemplary embodiment. Referring to FIGS. 1 and 2, the data processing system 10-1 is substantially the same as the data processing system 10 illustrated in FIG. 1, except additional structure and functions which will be described below. Thus, only the additional structure and functions will be described.

An external storage device 200-1 may include a signal detector 260. The signal detector 260 may detect a voltage level of a signal received through a frequency setting pin FSP connected between a host 100-1 and the external storage device 200-1 in low-speed mode. The frequency setting pin FSP may be a pin that can be mounted at one of the host 100-1 and the external storage device 200-1 and inserted into the other of the host 100-1 and the external storage device 200-1 to transmit and receive electrical signals.

The signal detector 260 may detect the voltage level of the signal, i.e., a direct current signal having a predetermined voltage level and may generate a frequency setting signal FSS according to the detected voltage level (e.g., 0.5, 1, 1.5 or 2 V). The device manager 230 may set the reference clock register 242 in the descriptor 240 according to the frequency setting signal FSS received from the signal detector 260. The device manager 230 may store a value (e.g., 0, 1, 2, or 3) corresponding to the frequency setting signal FSS in the reference clock register 242.

When the setting of the reference clock register 242 in the descriptor 240 is completed, the device manager 230 may generate a register setting response and transmit the register setting response to the host 100-1. The device manager 230 may receive a burst command from the host 100-1 and change a speed mode from the low-speed mode to the high-speed mode. At this time, the device manager 230 may refer to the reference clock register 242 and may operate the external storage device 200-1 at an operating frequency (e.g., of 19.2, 26, 38.4 or 52 MHz) corresponding to the value (i.e., 0, 1, 2, or 3) stored in the reference clock register 242.

According to an exemplary embodiment, the host 100-1 informs the external storage device 200-1 of the frequency of a reference clock signal for high-speed mode through a frequency setting pin FSP during initialization while the external storage device 200-1 is operating without the reference clock signal in low-speed mode, so that the external storage device 200-1 can operate in various host environments in which different reference clock signals are provided to the external storage device 200-1.

Figure 3:
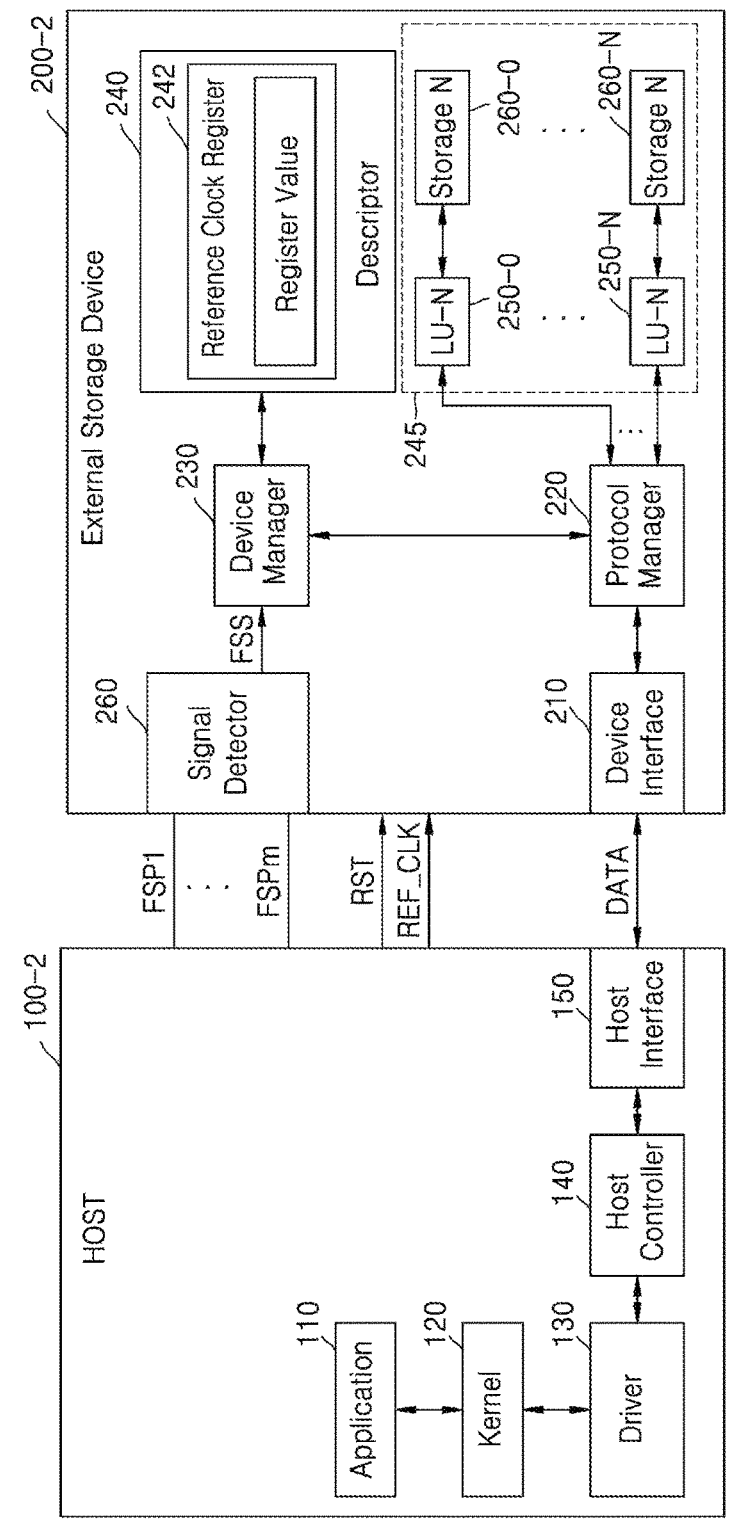
FIG. 3 is a block diagram of a data processing system according to another exemplary embodiment.

FIG. 3 is a block diagram of a data processing system 10-2 according to an exemplary embodiment. Referring to FIGS. 1 and 3, the data processing system 10-2 is substantially the same as the data processing system 10 illustrated in FIG. 1, except additional structure and functions which will be described below. Thus, only the additional structure and functions will be described.

An external storage device 200-2 may include the signal detector 260. The signal detector 260 may detect a frequency setting pin among a plurality of frequency setting pins FSP1 through FSPm connected between a host 100-2 and the external storage device 200-2, through which a signal is received in low-speed mode. The plurality of frequency setting pins FSP1 through FSPm may be a pin that can be mounted at one of the host 100-2 and the external storage device 200-2 and inserted into the other of the host 100-2 and the external storage device 200-2 to transmit and receive electrical signals.

The signal detector 260 may detect a frequency setting pin to which the signal is provided among the plurality of frequency setting pins FSP1 through FSPm and may generate the frequency setting signal FSS according to a number given to the detected frequency setting pin (e.g., number 1, 2, 3, or 4, when "m" is 4). The device manager 230 may set the reference clock register 242 in the descriptor 240 according to the frequency setting signal FSS received from the signal detector 260. The device manager 230 may store a value (e.g., 0, 1, 2, or 3) corresponding to the frequency setting signal FSS in the reference clock register 242.

When the setting of the reference clock register 242 in the descriptor 240 is completed, the device manager 230 may generate a register setting response and transmit the register setting response to the host 100-2. The device manager 230 may receive a burst command from the host 100-2 and change the speed mode from the low-speed mode to the high-speed mode. At this time, the device manager 230 may refer to the reference clock register 242 and may operate the external storage device 200-2 at an operating frequency (e.g., of 19.2, 26, 38.4 or 52 MHz) corresponding to the value (i.e., 0, 1, 2, or 3) stored in the reference clock register 242.

According to an exemplary embodiment, the host 100-2 informs the external storage device 200-2 of the frequency of a reference clock signal for high-speed mode through a plurality of frequency setting pins during initialization while the external storage device 200-2 is operating without the reference clock signal in low-speed mode, so that the external storage device 200-2 can operate in various host environments in which different reference clock signals are provided to the external storage device 200-2.

The register setting command and the information about an optimum reference frequency described with reference to FIG. 1 and the frequency setting signal FSS described with reference to FIGS. 2 and 3 may be information about a reference frequency for the high-speed mode.

The exemplary embodiments illustrated in FIGS. 1 through 3 are just examples in which the host 100, 100-1, or 100-2 or the external storage device 200, 200-1, or 200-2 informs each other of a frequency of a reference clock signal used in the high-speed mode in the low-speed mode. However, the inventive concept is not restricted thereto.

Figure 4:
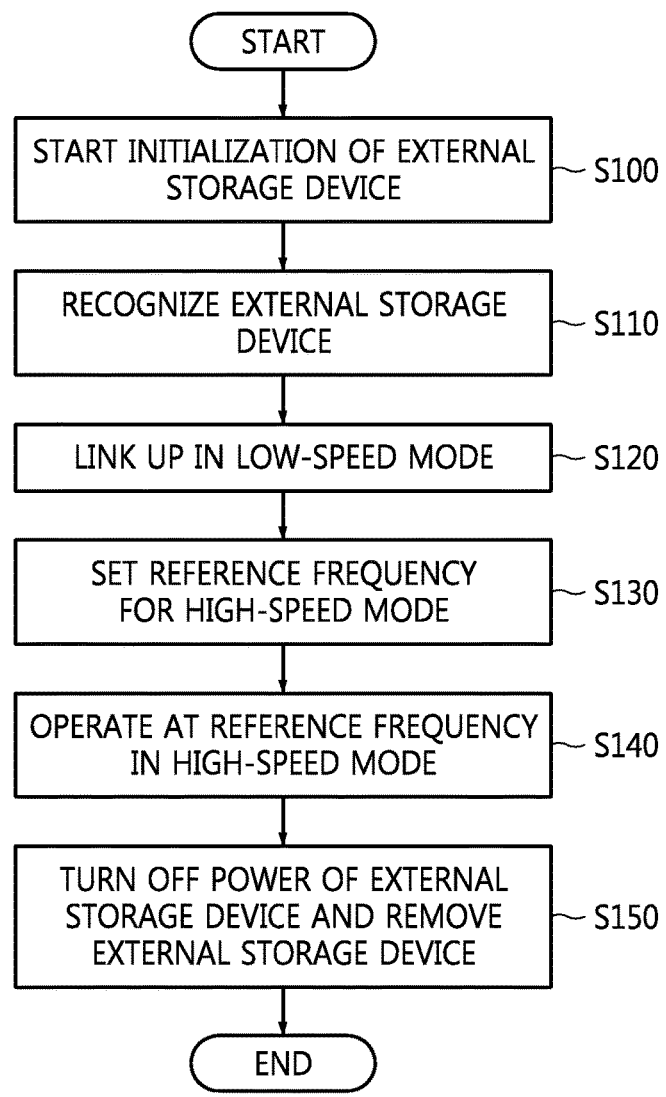
FIG. 4 is a flowchart of a method of setting a reference frequency for an external storage device according to an exemplary embodiment.
Figure 5:
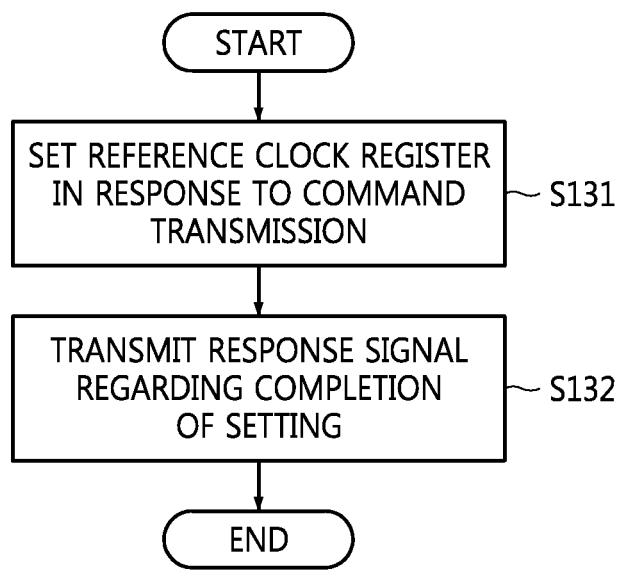
FIG. 5 is a flowchart of an operation of setting the reference frequency in the method illustrated in FIG. 4 according to an exemplary embodiment.
Figure 6:
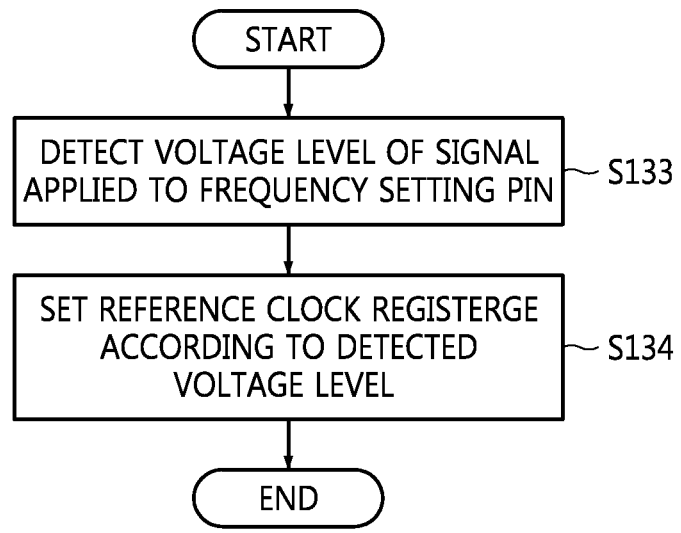
FIG. 6 is a flowchart of an operation of setting the reference frequency in the method illustrated in FIG. 4 according to another exemplary embodiment.
Figure 7:
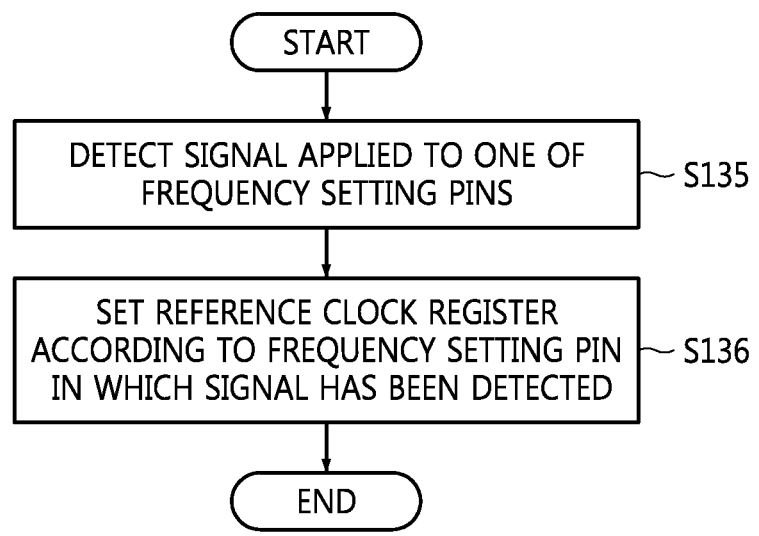
FIG. 7 is a flowchart of an operation of setting the reference frequency in the method illustrated in FIG. 4 according to another exemplary embodiment.
Figure 8:
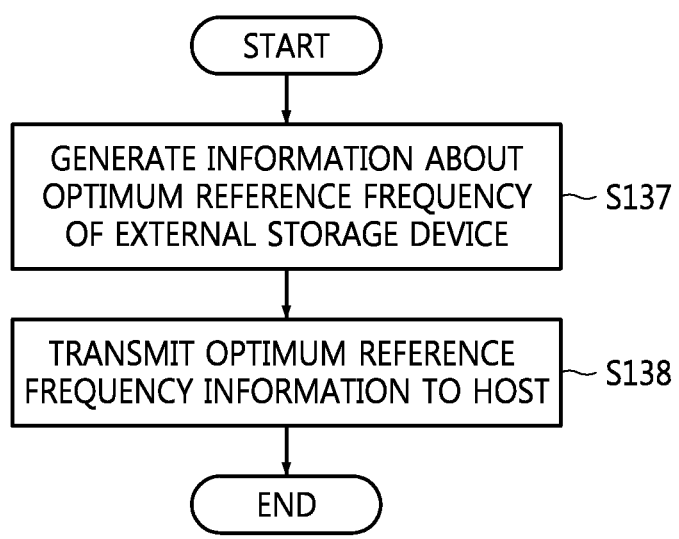
FIG. 8 is a flowchart of an operation of setting the reference frequency in the method illustrated in FIG. 4 according to another exemplary embodiment.

FIG. 4 is a flowchart of a method of setting a reference frequency for an external storage device according to an exemplary embodiment. FIG. 5 is a flowchart of an operation of setting the reference frequency in the method illustrated in FIG. 4 according to an exemplary embodiment. FIG. 6 is a flowchart of an operation of setting the reference frequency in the method illustrated in FIG. 4 according to another exemplary embodiment. FIG. 7 is a flowchart of an operation of setting the reference frequency in the method illustrated in FIG. 4 according to another exemplary embodiment. FIG. 8 is a flowchart of an operation of setting the reference frequency in the method illustrated in FIG. 4 according to another exemplary embodiment.

Referring to FIGS. 1 through 8, when the external storage device 200 is installed at the external memory slot compatible with the external storage device 200 in the host 100, when the power of the host 100 is turned off and then turned on in a state where the external storage device 200 has been installed at the external memory slot, or when the host 100 transmits the reset signal RST to the external storage device 200 during the operation of the external storage device 200, initialization of the external storage device 200 may start in operation S100. The initialization is an operation allowing the external storage device 200 to enter a state in which the external storage device 200 can operate in association with the host 100 and may include operations S110 through S130 which will be described below.

At the initialization, the application 110 may recognize the external storage device 200 in the physical or electrical manner in operation S110. If the application 110 recognizes the external storage device 200, the application 110 may transmit a request corresponding to a link-up command to the host interface 150. The host interface 150 may try to link up with the device interface 210. When the host interface 150 and the device interface 210 are linked up with each other, the host interface 150 and the device interface 210 may operate in the low-speed mode in operation S120.

The host 100, 100-1, or 100-2 and the external storage device 200, 200-1, or 200-2 may set a reference frequency of the high-speed mode using information about the reference frequency for the high-speed mode in the low-speed mode in operation S130.

Referring to FIG. 5, operation S130 may include operations S131 and S132. The application 110 illustrated in FIGS. 1 through 3 may transmit a register setting command to the device manager 230 in the low-speed mode and the device manager 230 may set the reference clock register 242 of the descriptor 240 according to the register setting command in operation S131.

When the setting of the reference clock register 242 in the descriptor 240 is completed, the device manager 230 may generate a register setting response and transmit the register setting response to the application 110 in operation S132.

Referring to FIG. 6, operation S130 may include operations S133 and S134. The signal detector 260 may detect a voltage level of a signal provided to the frequency setting pin FSP connected between the host 100-1 and the external storage device 200-1 in the low-speed mode and may generate the frequency setting signal FSS according to the detected voltage level (e.g., 0.5, 1, 1.5 or 2 V) in operation S133.

The device manager 230 may set the reference clock register 242 in the descriptor 240 according to the frequency setting signal FSS received from the signal detector 260 in operation S134. When the setting of the reference clock register 242 in the descriptor 240 is completed, the device manager 230 may generate a register setting response and transmit the register setting response to the host 100-1.

Referring to FIG. 7, operation S130 may include operations S135 and S136. The signal detector 260 may detect a frequency setting pin through which a signal is received among the plurality of frequency setting pins FSP1 through FSPm connected between the host 100-2 and the external storage device 200-2 in the low-speed mode and may generate the frequency setting signal FSS according to a number given to the detected frequency setting pin (e.g., number 1, 2, 3, or 4, when "m" is 4) in operation S135.

The device manager 230 may set the reference clock register 242 in the descriptor 240 according to the frequency setting signal FSS received from the signal detector 260 in operation S136. When the setting of the reference clock register 242 in the descriptor 240 is completed, the device manager 230 may generate a register setting response and transmit the register setting response to the host 100-2.

Referring to FIG. 8, operation S130 may include operations S137 and S138. The device manager 230 may generate information about an optimum reference frequency for the high-speed mode with reference to the descriptor 240 in the low-speed mode in operation S137. The device manager 230 may transmit the optimum reference frequency information to the host 100 in operation S138.

Referring back to FIG. 4, the application 110 may control the reference clock generator to provide the reference clock signal REF_CLK with the reference frequency (e.g., of 19.2, 26, 38.4 or 52 MHz), which is determined based on information (e.g., the register setting command, the frequency setting signal FSS, and the optimum reference frequency information) about the reference frequency for the high-speed mode, to the external storage device 200 in the high-speed mode in operation S140. In addition, the device manager 230 may refer to the reference clock register 242 and may operate the external storage device 200 at an operating frequency (e.g., of 19.2, 26, 38.4 or 52 MHz) corresponding to a value (e.g., 0, 1, 2, or 3) stored in the reference clock register 242.

The power of the external storage device 200 may be turned off and the external storage device 200 may be removed from the external memory slot in the host 100 in operation S150.

If the host 100 is a first host, after the external storage device 200 is removed from the external memory slot of the host 100, the external storage device 200 may be installed at a second host different from the first host. Low-speed mode, high-speed mode, and reference frequency of the first host may be referred to as first low-speed mode, first high-speed mode, and first reference frequency. Low-speed mode, high-speed mode, and reference frequency of the second host may be referred to as second low-speed mode, second high-speed mode, and second reference frequency.

When the external storage device 200 is connected to the first host and operations S100 through S140 are performed, the external storage device 200 may operate in the first high-speed mode at a reference clock signal with the first reference frequency set using information about the first reference frequency in the first low-speed mode. Thereafter, the external storage device 200 may be removed from the external memory slot of the first host and installed at the second host.

When the external storage device 200 is connected to the second host and operations S100 through S140 are performed, the external storage device 200 may operate in the second high-speed mode at a reference clock signal with the second reference frequency set using information about the second reference frequency in the second low-speed mode.

The first reference frequency may be the same as the second reference frequency. If the first and second reference frequencies are different from each other, a reference frequency may be set to be suitable to the characteristics of the first host or the second host through operation S130.

As described above, according to an exemplary embodiment, a host and an external storage device inform each other of a frequency of a reference clock signal for high-speed mode through signal transmission between the host and the external storage device during initialization in which the external storage device operates without the reference clock signal in low-speed mode, so that the external storage device can operate in various host environments in which different reference clock signals are provided.

While not restricted thereto, an exemplary embodiment can be embodied as computer readable code on a non-transitory computer readable recording medium. The non-transitory computer readable recording medium is any data storage device that can store data which can be thereafter read by a computer system. Examples of the non-transitory computer readable recording medium may include read-only memory (ROM), random-access memory (RAM), flash memory, CD-ROMs, magnetic tapes, floppy disks, and optical data storage devices. A program code for executing a method of the exemplary embodiment may be transmitted in carrier waves (such as data transmission through the internet).

The non-transitory computer readable recording medium can also be distributed over network coupled computer systems so that the computer readable code is stored and executed in a distributed fashion. Moreover, one or more components or elements of the above-described apparatuses may include a processor or microprocessor executing a computer program stored in a computer-readable medium.

While the inventive concept has been particularly shown and described with reference to exemplary embodiments thereof, it will be understood by those of ordinary skill in the art that various changes in forms and details may be made therein without departing from the spirit and scope of the inventive concept as defined by the appended claims.

What is claimed is:

1. A removable storage device comprising:
    a device manager configured to set a first reference frequency using first reference frequency information received in a first low-speed mode after the removable storage device is connected to a first host, the first reference frequency being an operating frequency of the removable storage device in a first high-speed mode, and to set a second reference frequency using second reference frequency information received in a second low-speed mode after the removable storage device is connected to a second host, the second reference frequency being an operating frequency of the removable storage device in a second high-speed mode;
    a device interface configured to communicate with the first host in at least one of the first low-speed mode and the first high-speed mode, and to communicate with the second host in at least one of the second low-speed mode and the second high-speed mode;
    a data manager configured to interpret a type of data and control the data to be processed by the device manager; and
    a reference clock register configured to store a first value and a second value corresponding to the first reference frequency information and the second reference frequency information respectively,
    wherein the removable storage device is configured to be attachable to and detachable from the first and second hosts respectively, and is further configured to operate according to a reference clock signal which toggles between the first reference frequency in the first high-speed mode and the second reference frequency in the second high-speed mode, and
    wherein the first reference frequency determines an internal operating speed of the removable storage device in the first high-speed mode for a synchronization between the first host and the removable storage device, and the second reference frequency determines an internal operating speed of the removable storage device in the second high-speed mode for a synchronization between the second host and the removable storage device.

2. The removable storage device of claim 1, wherein the removable storage device is a universal flash storage (UFS).

3. The removable storage device of claim 1, wherein the first reference frequency information and the second reference frequency information are included in a first command generated by the first host and in a second command generated by the second host.

4. The removable storage device of claim 1, wherein the device manager is configured to generate information about an optimum reference frequencies for each of the first and second high-speed modes, and each of the first and second reference frequencies is determined at the first and second hosts based on the optimum reference frequencies.

5. A method of operating a removable storage device, the method comprising:
    performing an initialization of the removable storage device, the removable storage device being removable from a first external host device and a second external host device;
    linking up with the first external host device in a first low-speed mode upon being attached to the first external host device;
    receiving a first register setting command from the first external host device in the first low-speed mode, the first register setting command including first reference frequency information for a first high-speed mode, the first reference frequency information dictating a first reference frequency with which the removable storage device operates in the first high-speed mode;
    setting the first reference frequency in accordance with the first reference frequency information by changing a register value of a reference clock register;
    sending a first register setting response to the first external host device after setting the reference clock register in the first low-speed mode;
    operating the removable storage device in the first high-speed mode with a first reference clock signal having the first reference frequency, the first reference clock signal being provided by the first external host device,
    after being removed from the first external host device, linking up with the second external host device in a second low-speed mode upon being attached to the second external host device:
    receiving a second register setting command from the second external host device in the second low-speed mode, the second register setting command including second reference frequency information for a second high-speed mode, the second reference frequency information dictating a second reference frequency with which the removable storage device operates in the second high-speed mode;
    setting the second reference frequency in accordance with the second reference frequency information by changing the register value of the reference clock register;
    sending a second register setting response to the second external host device after setting the reference clock register in the second low-speed mode; and
    operating the removable storage device in the second high-speed mode with a second reference clock signal having the second reference frequency, the second reference clock signal being provided by the second external host device,
    wherein the setting the first reference frequency includes detecting a voltage level of a signal received through a frequency setting pin coupled to the first external host device, generating, by the removable storage device, a frequency setting signal according to the detected voltage level, and determining the register value to be stored into the reference clock register according to the frequency setting signal.

6. The method of claim 5, wherein the initialization starts in response to one of power-on detection and receiving a reset signal from the first external host device.

7. The method of claim 5, wherein the reference clock register stores at least four different register values, the at least four different register values indicating high-speed mode frequencies of the removable storage device.

8. The method of claim 7, wherein the at least four different register values are applied for different external host devices respectively, wherein the different external host devices operate with different reference clock frequencies in high speed-mode.

9. The method of claim 7, wherein the high-speed mode frequencies of the removable storage device are 19.2 MHz, 26 MHz, 38.4 MHz, and 52 MHz respectively.

10. The method of claim 5, wherein the first low-speed mode indicates an operating mode without a reference clock signal.

11. The method of claim 5, wherein the first low-speed mode is a pulse width modulation (PWM) mode.

12. A removable storage device determining a reference frequency in a low-speed mode, the removable storage device comprising:
a device interface configured to be attached to a first host device, to receive a first register setting command from the first host device, and to transmit a first register setting response to the first host device, the first register setting command including first reference frequency information indicating a first reference frequency for high-speed mode of the removable storage device;
a signal detector configured to generate a frequency setting signal;
a reference clock register, being coupled with the device interface, configured to store a first register value corresponding to the first reference frequency information in response to the first register setting command; and
a device manager configured to set the first reference frequency for high-speed mode operation of the removable storage device in accordance with the first register value,
wherein the transmitting the first register setting response to the first host device by the device interface occurs after storing the first register value,
wherein the device manager further configured to set the first reference frequency by detecting a voltage level of a signal received through a frequency setting pin coupled to the first host device and to determine the first register value to be stored into the reference clock register according to the frequency setting signal which is generated by the signal detector according to the detected voltage level,
wherein the device interface is further configured to, after being removed from the first host device, be attached to a second host device, to receive a second register setting command from the second host device, and to transmit a second register setting response to the second host device, the second register setting command including second reference frequency information, the second reference frequency information indicating a second reference frequency for high-speed mode of the removable storage device, and
the reference clock register further configured to store a second register value corresponding to the second reference frequency information in response to the second register setting command, and
the device manager further configured to set the second reference frequency for high-speed mode of the removable storage device in accordance with the second register value,
wherein transmitting the second register setting response to the second host device by the device interface occurs after storing the second register value, and
wherein the first reference frequency and the second reference frequency are different.

13. The removable storage device of claim 12, wherein the removable storage device is a universal flash storage (UFS) device in compliance with UFS specification version 2.0 of JEDEC standard.

14. The removable storage device of claim 12, wherein the device manager is further configured to set the second reference frequency by detecting voltage levels of signals received through the frequency setting pin located in the device interface and to determine the second register value to be stored into the reference clock register.

15. The removable storage device of claim 12, wherein the reference clock register stores at least four different register values, the at least four different register values indicating high-speed mode frequencies of the removable storage device.

16. The removable storage device of claim 15, wherein the first register value is applied to the first host device and the second register value is applied to the second host device respectively, wherein the first host device and the second host device provide the removable storage device with reference clocks having different frequencies.

17. The removable storage device of claim 15, wherein the high-speed mode frequencies of the removable storage device are 19.2 MHz, 26 MHz, 38.4 MHz, and 52 MHz respectively.

18. The removable storage device of claim 12, wherein the first register value and the second register value of the reference clock register are preserved after power-off of the removable storage device.

* * * * *